(12) United States Patent
Fukudome

(10) Patent No.: US 10,557,395 B2
(45) Date of Patent: Feb. 11, 2020

(54) THERMOELECTRIC GENERATING UNIT, THERMOELECTRIC GENERATOR USING THE THERMOELECTRIC GENERATING UNIT, MOUNTING STRUCTURE OF THE THERMOELECTRIC GENERATOR, AND EXHAUST DUCT AND ENGINE INCLUDING THE MOUNTING STRUCTURE

(71) Applicant: YANMAR CO., LTD., Osaka-shi (JP)

(72) Inventor: Jiro Fukudome, Osaka (JP)

(73) Assignee: YANMAR CO., LTD, Osaka (JP)

(*) Notice: Subject to any disclaimer, the term of this patent is extended or adjusted under 35 U.S.C. 154(b) by 224 days.

(21) Appl. No.: 15/536,311

(22) PCT Filed: Dec. 10, 2015

(86) PCT No.: PCT/JP2015/084637
§ 371 (c)(1),
(2) Date: Jun. 15, 2017

(87) PCT Pub. No.: WO2016/098679
PCT Pub. Date: Jun. 23, 2016

(65) Prior Publication Data
US 2017/0342889 A1 Nov. 30, 2017

(30) Foreign Application Priority Data
Dec. 16, 2014 (JP) ................. 2014-253943

(51) Int. Cl.
*F01N 5/02* (2006.01)
*H01L 35/30* (2006.01)
(Continued)

(52) U.S. Cl.
CPC .............. *F01N 5/025* (2013.01); *H01L 35/30* (2013.01); *H01L 35/32* (2013.01); *F01N 5/02* (2013.01); *H01L 35/00* (2013.01); *Y02T 10/16* (2013.01)

(58) Field of Classification Search
CPC . F01N 5/025; F01N 5/02; H01L 35/00; H01L 35/30; H01L 35/32; H01L 35/34; H02N 11/00; Y02T 10/16
See application file for complete search history.

(56) References Cited

U.S. PATENT DOCUMENTS 4,734,139 A * 3/1988 Shakun ................... H01L 35/30
136/205
2011/0265838 A1 11/2011 Kambe
(Continued)

FOREIGN PATENT DOCUMENTS

CN 2569038 Y 8/2003
CN 200941023 Y 8/2007
(Continued)

OTHER PUBLICATIONS

Chinese Office Action dated Jun. 1, 2018 issued in corresponding CN Application 201580067047.2.
(Continued)

*Primary Examiner* — Matthew T Martin
(74) *Attorney, Agent, or Firm* — Norton Rose Fulbright US LLP

(57) ABSTRACT

A thermoelectric generating unit is configured to generate based on a temperature difference between a cold side and a hot side. A heating part includes a plate-like hollow member and tubular member. The hollow member is provided along a hot-side surface of a thermoelectric transducer, and forms a plate-like cavity inside. The tubular member forms a tubular cavity which communicates the plate-like cavity, with two open ends of the tubular member being positioned distantly from each other and connected to the plate-like hollow member. The tubular member is heated from outside by a hot fluid. The plate-like cavity and the tubular cavity form a circulation path in which a heating medium charged in the cavities circulates.

9 Claims, 9 Drawing Sheets

(51) Int. Cl.
*H01L 35/32* (2006.01)
*H01L 35/00* (2006.01)

(56) References Cited

U.S. PATENT DOCUMENTS

2012/0192574 A1\* 8/2012 Ghoshal .................. F25B 21/02
                                                                62/3.2
2015/0068575 A1   3/2015 Komitsu

FOREIGN PATENT DOCUMENTS

| CN | 101882898 A | 11/2010 |
|----|-------------|---------|
| JP | 2002-272152 A | 9/2002 |
| JP | 2014-001631 A | 1/2014 |
| JP | 5432927 B2 | 3/2014 |
| JP | 5804089 B2 | 11/2015 |
| WO | 2010/084718 A1 | 7/2010 |
| WO | 2013/114428 A1 | 8/2013 |

OTHER PUBLICATIONS

International Search Report dated Mar. 1, 2016, issued for PCT/JP2015/084637.

\* cited by examiner

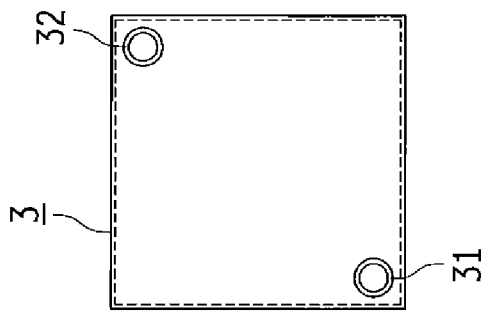
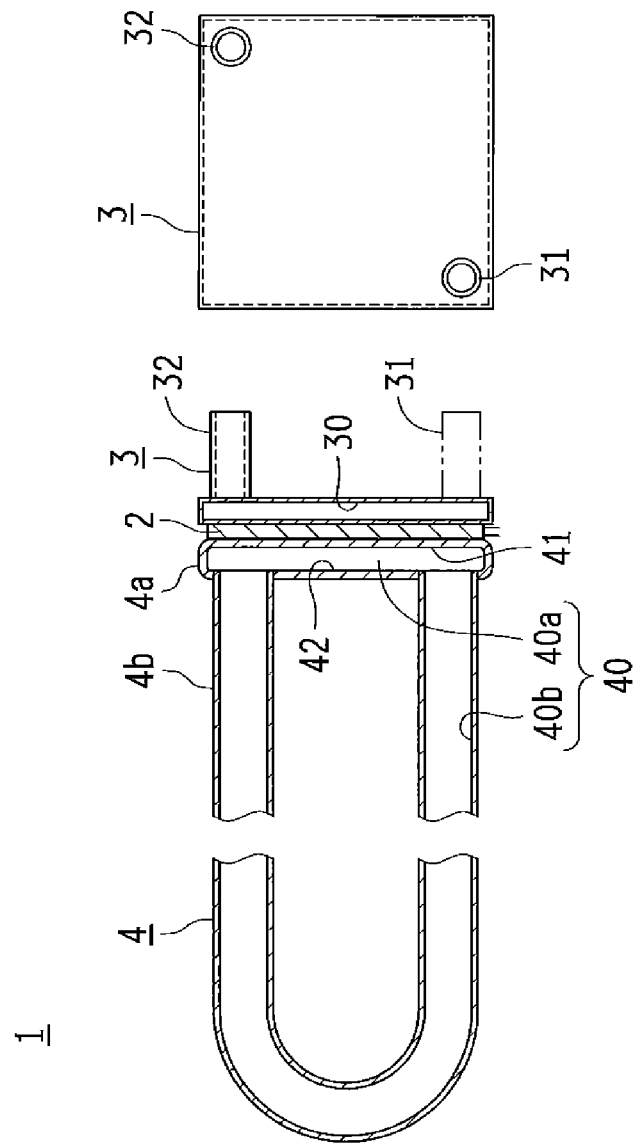
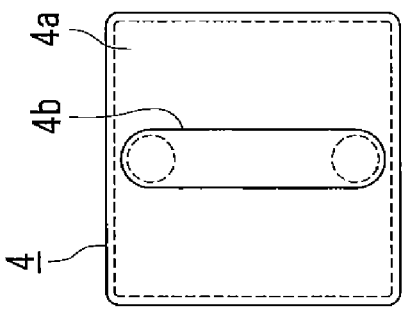

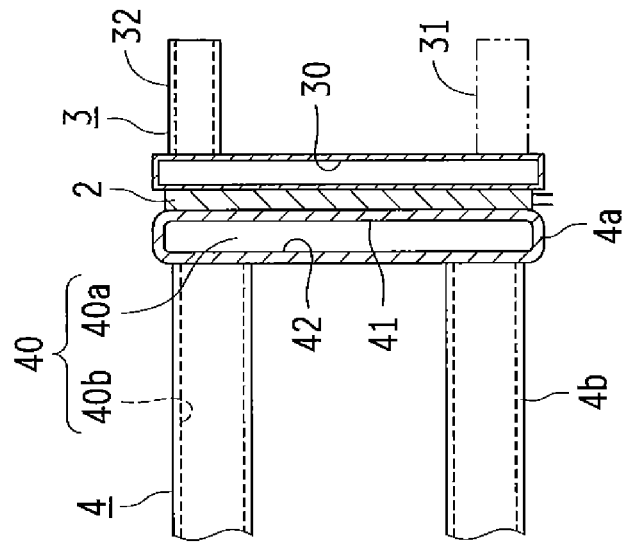
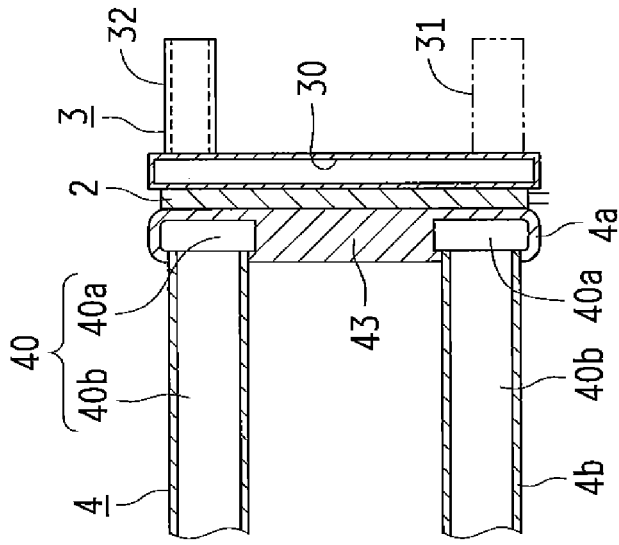
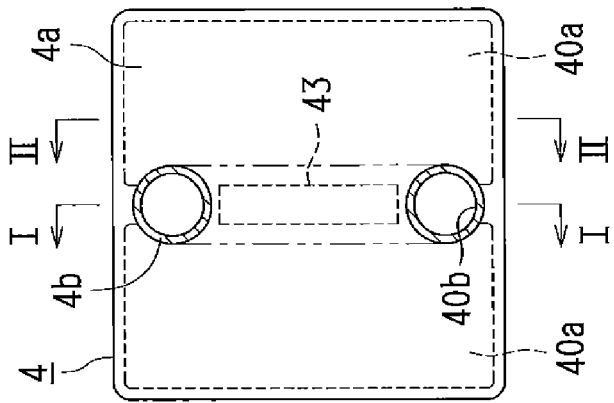

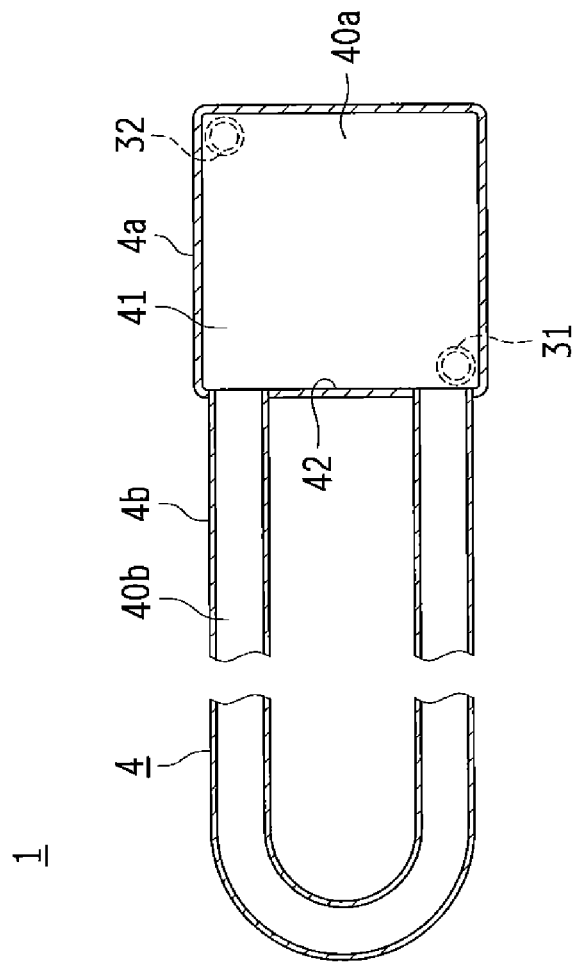
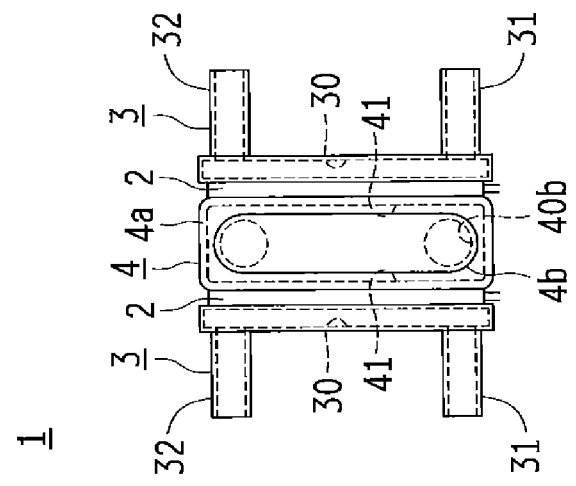
FIG.3(a)
FIG.3(b)

THERMOELECTRIC GENERATING UNIT, THERMOELECTRIC GENERATOR USING THE THERMOELECTRIC GENERATING UNIT, MOUNTING STRUCTURE OF THE THERMOELECTRIC GENERATOR, AND EXHAUST DUCT AND ENGINE INCLUDING THE MOUNTING STRUCTURE

TECHNICAL FIELD

The present invention relates to a thermoelectric generating unit using a thermoelectric transducer, a thermoelectric generator using the thermoelectric generating unit, a mounting structure of the thermoelectric generator, and an exhaust duct and an engine including the mounting structure.

BACKGROUND ART

A conventionally known thermoelectric generator is arranged to generate electric power by a temperature difference between a cold side and a hot side of a thermoelectric module in a thermoelectric generating module, wherein the cold side is cooled by a cooling means and the hot side is heated (for example, see PTL 1).

In this thermoelectric generator, the thermoelectric generating module is provided in a thermoelectric conversion part in a circulation path in which steam of a heating medium generated in an evaporation part circulates, and the hot side of the thermoelectric generating module is heated by the steam.

CITATION LIST

Patent Literature

[PTL 1] JP 2002-272152 A

SUMMARY OF INVENTION

Solution to Problem

However, this conventional thermoelectric generator has a following disadvantage. In the conventional thermoelectric generator, the evaporation part is configured to turn the heating medium into steam by hot exhaust gas passing in the duct. Since the steam for heating the thermoelectric generating module has to be introduced into the thermoelectric conversion part which is distant from the duct serving as the heat source, it is difficult to heat the hot side of the thermoelectric generating module efficiently.

As another disadvantage, since the steam for heating the thermoelectric generating module has to be introduced into the thermoelectric conversion part which is distant from the duct serving as the heat source, this configuration increases the size of the thermoelectric generator.

The present invention is made in view of these circumstances, and intends to provide a thermoelectric generating unit which can enhance heat exchange performance on the hot side and which can be installed compactly, a thermoelectric generator using the thermoelectric generating unit, a mounting structure of the thermoelectric generator, and an exhaust duct and an engine including the mounting structure.

Solution to Problem

A thermoelectric generating unit according to the present invention for solving the above-mentioned object has a thermoelectric transducer, a cooling part on a cold side of the thermoelectric transducer, and a heating part on a hot side of the thermoelectric transducer for supplying steam of a heating medium, and is configured to generate electric power by a temperature difference between the cold side and the hot side. The heating part includes: a plate-like hollow member provided along a hot-side surface of the thermoelectric transducer, the plate-like hollow member forming a plate-like cavity inside; and a tubular member having two open ends being positioned distantly from each other and connected to the plate-like hollow member, the tubular member forming a tubular cavity communicating the plate-like cavity with the two open ends, the tubular member heated from outside by a hot fluid. The plate-like cavity and the tubular cavity form a circulation path in which a heating medium charged in the cavities circulates.

In this thermoelectric generating unit, the two open ends of the tubular member may be connected to a same connecting surface of the plate-like hollow member, and the connecting surface may be opposed to a heating surface of the plate-like hollow member which makes contact with the thermoelectric transducer.

In this thermoelectric generating unit, a reinforcement bridge which connects the connecting surface and the heating surface may be provided in the plate-like cavity of the plate-like hollow member, at a position that keeps communication between the plate-like hollow member and the two open ends of the tubular member and that does not completely block the plate-like cavity.

A thermoelectric generator according to the present invention for solving the above-mentioned object includes a plurality of above-mentioned thermoelectric generating units. The thermoelectric generating units are arranged in a row direction and a column direction, and a plurality of thermoelectric transducers is connected to each other in a planar pattern.

In this thermoelectric generator, the heating surface of each of the plate-like hollow members and/or a cooling surface of each of the cooling parts, each surface making contact with at least the thermoelectric transducer, may be partially or entirely integrated in a modular plate-like form.

In this thermoelectric generator, the plate-like cavities of adjacent ones of the thermoelectric generating units may be communicated by a path.

This thermoelectric generator may further include: a heating plate which constitutes the heating surface; a connecting plate which constitutes a connecting surface to which the tubular members are connected; and a framing plate which creates a space between the heating surface and the connecting surface and thereby provides at least one plate-like cavity. The heating plate, the connecting plate, and the framing plate may be joined together in a modular plate-like form in which the plate-like hollow members are integrated.

Regarding a mounting structure of the thermoelectric generator according to the present invention for solving the above-mentioned object, a duct has an opening, the thermoelectric generators are mounted in such a manner as to close the opening, and the connecting surface for the tubular members and the plate-like hollow members is exposed in the duct.

In this mounting structure of the thermoelectric generator, a duct may have a plurality of openings, the thermoelectric generators may be mounted in such a manner as to close the openings, and the tubular members exposed in the duct may be arranged in an overlapped manner in a gas flow direction in the duct.

Regarding an exhaust duct according to the present invention for solving the above-mentioned object, a part of the exhaust duct includes the above-mentioned mounting structure of the thermoelectric generator.

Regarding an engine according to the present invention for solving the above-mentioned object, the engine includes the above-mentioned mounting structure of the thermoelectric generator in a part of an exhaust duct.

Advantageous Effects of Invention

As described above, in the present invention according to claim 1, the plate-like hollow member provided along a hot-side surface of the thermoelectric transducer and the tubular member heated from outside by a hot fluid are connected to form a circulation path in which a heating medium circulates. This arrangement can realize a compact structure. Besides, since there is no useless path and space except the tubular cavity of the tubular member and the plate-like cavity of the plate-like hollow member, heat can be transported in a stable and highly efficient manner.

In the present invention according to claim 2, the two open ends of the tubular member are connected to a same connecting surface of the plate-like hollow member, and the connecting surface is opposed to a heating surface of the plate-like hollow member which makes contact with the thermoelectric transducer. Owing to this arrangement, steam generated in the tubular member can be directly ejected onto the heating surface which is opposed to the connecting surface to which the tubular member is connected. As a result, the hot-side surface of the thermoelectric transducer can be heated to the maximum.

In the present invention according to claim 3, a reinforcement bridge which connects the connecting surface and the heating surface is provided in the plate-like cavity of the plate-like hollow member, at a position that keeps communication between the plate-like hollow member and the two open ends of the tubular member and that does not completely block the plate-like cavity. This arrangement can prevent deformation of the plate-like cavity caused by a steam pressure, and can thereby achieve excellent durability and safety.

In the thermoelectric generator according to claim 4, a plurality of above-mentioned thermoelectric generating units is arranged in a row direction and a column direction, and a plurality of thermoelectric transducers is connected to each other in a planar pattern. This arrangement enables power generation by heat exchange.

In the thermoelectric generator according to claim 5, the heating surface of each of the plate-like hollow members and/or a cooling surface of each of the cooling parts, each surface making contact with at least the thermoelectric transducer, is/are partially or entirely integrated in a modular plate-like form. This arrangement can provide a thermoelectric generator having an integrated structure with excellent handleability.

In the thermoelectric generator according to claim 6, the plate-like cavities of adjacent ones of the thermoelectric generating units are communicated by a path. This arrangement allows uniform heating of the thermoelectric transducers of the thermoelectric generating units, and can thereby maximize the power generation output.

In the thermoelectric generator according to claim 7, the thermoelectric generator is further equipped with: a heating plate which constitutes the heating surface; a connecting plate which constitutes a connecting surface to which the tubular members are connected; and a framing plate which creates a space between the heating surface and the connecting surface and thereby provides at least one plate-like cavity. The heating plate, the connecting plate, and the framing plate are joined together in a modular plate-like form in which the plate-like hollow members are integrated. Owing to this arrangement, the plate-like hollow member part of the thermoelectric generator can be made in a rational and simple structure, so that the cost for the thermoelectric generator can be reduced.

In the mounting structure of the thermoelectric generator according to claim 8, a duct has an opening, the thermoelectric generators are mounted in such a manner as to close the opening, and the connecting surface for the tubular members and the plate-like hollow members is exposed in the duct. Owing to this arrangement, it is possible to heat not only the tubular members but also the plate-like hollow members, and heat can be recovered efficiently, without heat loss, from exhaust gas passing in the duct.

In the mounting structure of the thermoelectric generator according to claim 9, a duct has a plurality of openings, the thermoelectric generators are mounted in such a manner as to close the openings, and the tubular members exposed in the duct are arranged in an overlapped manner in a gas flow direction in the duct. Owing to this arrangement, it is possible to install the thermoelectric generator compactly in a space-saving manner.

BRIEF DESCRIPTION OF DRAWINGS

FIG. 1(*a*) is a partially omitted side sectional view of an entire schematic configuration of a thermoelectric generating unit according to the present invention; FIG. 1(*b*) is a front view thereof; and FIG. 1(*c*) is a rear view thereof.

FIG. 2(*a*) is a partially broken front view showing another embodiment of the thermoelectric generating unit according to the present invention; FIG. 2(*b*) is a sectional view taken along the line I-I in FIG. 2(*a*); and FIG. 2(*c*) is a sectional view taken along the line II-II in FIG. 2(*a*).

FIG. 3(*a*) is a partially omitted side sectional view of yet another embodiment of the thermoelectric generating unit according to the present invention; and FIG. 3(*b*) is a front view thereof.

FIG. 4(*b*) is a partially omitted sectional view thereof taken along the line III-III in FIG. 4(*a*).

FIG. 5(*b*) is a partially omitted sectional view thereof taken along the line IV-IV in FIG. 5(*a*).

FIG. 6(*b*) is a plan view of a heating plate employed in the thermoelectric generator; FIG. 6(*c*) is a plan view of a connecting plate employed in the thermoelectric generator; and FIG. 6(*d*) is a plan view of a framing plate employed in the thermoelectric generator.

FIG. 7(*b*) is a partial vertical sectional view thereof.

DESCRIPTION OF EMBODIMENTS

Figure 4B:
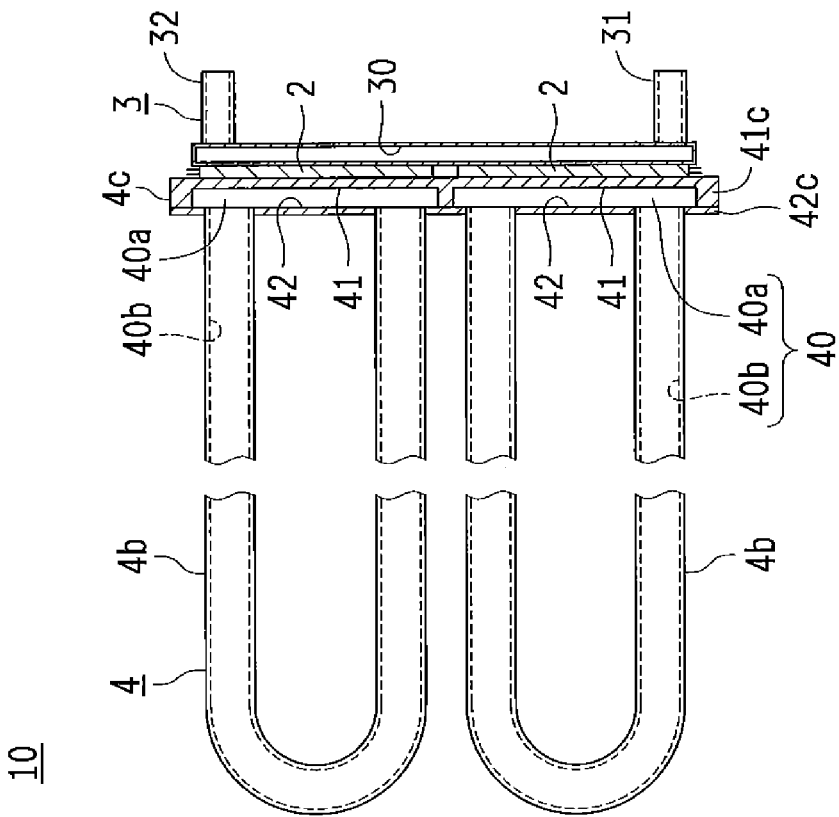
FIG. 4(*a*) is a front view showing an entire schematic configuration of a thermoelectric generator according to the present invention.

Hereinafter, embodiments of the present invention are described with reference to the drawings.

FIG. 1 represents an entire schematic configuration of a thermoelectric generating unit 1.

The thermoelectric generating unit 1 has a thermoelectric transducer 2, a cooling part 3 on a cold side of the thermoelectric transducer 2, and a heating part 4 on a hot side of the thermoelectric transducer 2 for supplying steam of a heating medium. The thermoelectric generating unit 1 is configured to generate electric power by a temperature difference between the cold side and the hot side. The heating part 4 has a plate-like hollow member 4a and a tubular member 4b. The hollow member 4a is provided along a hot-side surface of the thermoelectric transducer 2, and forms a plate-like cavity 40a inside. The tubular member 4b has two open ends being positioned distantly from each other and connected to the plate-like hollow member 4a. The tubular member 4b forms a tubular cavity 40b which communicates the plate-like cavity 40a with the two open ends. The tubular member 4b is heated from outside by a hot fluid. The plate-like cavity 40a and the tubular cavity 40b form a circulation path 40 in which a heating medium charged in the cavities 40a, 40b circulates.

The thermoelectric transducer 2 has a plate-like shape, and is configured to cool a surface on the cold side and to heat the other surface on the hot side, thereby generating electric power by the temperature difference.

The cooling part 3 is made of a metallic material having an excellent heat conductivity, and has a plate-like shape for making contact with the cold-side surface of the thermoelectric transducer 2. The cooling part 3 contains a cooling water path 30 which has a plate-like shape arranged to distribute cooling water to an entire surface which makes contact with the thermoelectric transducer 2. The cooling water path 30 is equipped with a cooling water inflow pipe 31 and a cooling water discharge pipe 32 at opposed positions in the cooling water path 30. Cooling water flows into the cooling water path 30 from the cooling water inflow pipe 31, cools the cold-side surface of the thermoelectric transducer 2 which makes contact with the cooling part 3, and is then discharged from the cooling water discharge pipe 32. As described above, the plate-like cooling water path 30 has a plate-like shape arranged to distribute cooling water to the entire surface which makes contact with the thermoelectric transducer 2. However, as far as the cooling water path 30 can cool the cold-side surface of the thermoelectric transducer 2 entirely and evenly, the shape of the cooling water path 30 is not particularly limited. Hence, the cooling water path 30 may have a plate-like shape arranged to distribute cooling water and having a greater area than the cold-side surface of the thermoelectric transducer 2. Since the cooling part 3 should have a plate-like shape for making contact with the entire area of the cold-side surface of the thermoelectric transducer 2, if the thermoelectric transducer 2 has a curved surface, the cooling part 3 may be also formed in a plate-like shape having a curved surface.

The heating part 4 is made of a metallic material having an excellent heat conductivity. The heating part 4 has the plate-like hollow member 4a provided in contact with the thermoelectric transducer 2, and the tubular member 4b which is exposed in the duct in which a hot fluid passes and which is heated from outside by the hot fluid. A heating medium is charged inside the heating part 4. The heating medium may be enclosed in advance when the plate-like hollow member 4a and the tubular member 4b are connected, or may be charged by a charge pipe 47 (see FIGS. 6 and 7) to be described later.

The plate-like hollow member 4a has a plate-like shape for making contact with the hot-side surface of the thermoelectric transducer 2. The plate-like hollow member 4a contains the plate-like cavity 40a arranged to distribute steam of the heating medium to the entire area of a heating surface 41 which makes contact with the thermoelectric transducer 2. Since the plate-like hollow member 4a should make contact with the entire area of the hot-side surface of the thermoelectric transducer 2, if the thermoelectric transducer 2 has a curved surface, the plate-like hollow member 4a may be also formed in a plate-like shape having a curved surface.

The tubular member 4b is formed by a U-tube, and two open ends thereof are arranged to be connectable to a connecting surface 42 opposed to the heating surface 41 of the plate-like hollow member 4a. Specifically, the two open ends are connected to the connecting surface 42, for example, at distant positions on a center line which connects center points of two opposed sides of the connecting surface 42. In this connected state, the tubular cavity 40b inside the tubular member 4b and the plate-like cavity 40a inside the plate-like hollow member 4a are communicated with each other, forming the circulation path 40 for circulation of the heating medium charged in the cavities 40a, 40b. Namely, when the tubular member 4b is exposed to a path where a hot fluid flows, the heating medium charged in the tubular cavity 40b of the tubular member 4b is heated by the hot fluid passing the outside of the tubular member 4b, turns into steam, and is discharged from the tubular cavity 40b to the plate-like cavity 40a. Specifically, the steam is discharged from a higher open end of the tubular cavity 40b to the plate-like cavity 40a. The steam of the heating medium discharged into the plate-like cavity 40a falls in the plate-like cavity 40a along the heating surface 41, releases heat from the heating surface 41 and thereby heats the thermoelectric transducer 2, and eventually condensates. The condensed heating medium flows back into the tubular cavity 40b from a lower open end of the tubular cavity 40b, turns into steam again, and is discharged to the plate-like cavity 40a. By repeating this circulation, the circulation path 40 serves as a naturally circulating loop path.

In the thus configured thermoelectric generating unit 1, the connecting surface 42 at which the two open ends are disposed is opposed to the heating surface 41. Hence, the steam from the higher open end of the tubular cavity 40b is directly ejected to the heating surface 41 of the plate-like cavity 40a. Therefore, even if sufficient heat cannot be recovered from the tubular member 4b, the thermoelectric generating unit 1 can release heat from the heating surface 41 and can heat the thermoelectric transducer 2 very efficiently.

Having said that, the plate-like cavity 40a is subjected to a high pressure due to the pressure of the steam flowing into the plate-like cavity 40a. Hence, longtime use may lead to an increase in the distance between the heating surface 41 and the connecting surface 42, and thus may cause expansion of the plate-like cavity 40a. To address this concern, a bridge 43 which integrally connects the heating surface 41 and the connecting surface 42 may be provided in the plate-like cavity 40a, as shown in FIG. 2. Preferably, the bridge 43 is provided at a position for providing communication between the two open ends, so as not to block the flow of the steam discharged from one of the open ends of the tubular cavity 40b to the plate-like cavity 40a and returning to the tubular cavity 40b from the other open end. Specifically, the bridge 43 may be located, for example, between the two open ends and on the center line which connects the center points of the two opposed sides of the connecting surface 42, as shown in FIG. 2. At this position, the bridge 43 reinforces the central portion of the plate-like cavity 40a which is most distant from the periphery of the plate-like cavity 40a and which is weak in strength, thus being effective in prevention of expansion of the plate-like cavity 40a.

It should be noted that steam does not flow through the part of the heating surface 41 where the bridge 43 is provided. Hence, at this portion, the thermoelectric transducer 2 is heated only by heat transfer from the bridge 43. If the temperature of the part of the heating surface 41 where the bridge 43 is provided is lower than the other part of the heating surface 41 where the steam passes, the output of the thermoelectric transducer 2 is undesirably determined by the part where the temperature difference between the cold-side surface and the hot-side surface is the smallest. Therefore, the bridge 43 is preferably as small as possible in order to prevent an uneven temperature distribution on the heating surface 41 of the steam-flowing plate-like cavity 40a. As the bridge 43, only one strip-like bridge 43 is provided at the central portion in the present embodiment, but instead a plurality of dot-like or linear bridges 43 may be provided in a dispersed manner.

In the thermoelectric generating unit 1 of the above embodiments, the connecting surface 42 and the heating surface 41 of the tubular member 4b are opposed to each other, so that the steam from the tubular member 4b can be directly ejected onto the heating surface 41. However, the thermoelectric generating unit 1 should not be limited to this configuration. For example, as shown in FIG. 3, the opposed surfaces of the plate-like cavity 40a may both serve as the heating surfaces 41, and the thermoelectric transducer 2 may be provided adjacent to each of these heating surfaces 41. Then, the cooling part 3 may be provided on the cold-side surface of each of the thermoelectric transducers 2. One side surface between the heating surfaces 41 may serve as the connecting surface 42 to which the tubular member 4b is connected. According to this alternative configuration, one tubular member 4b can heat two thermoelectric transducers 2. Hence, in the case where a large amount of heat can be recovered from the tubular member 4b, this configuration which can heat two thermoelectric transducers 2 can advantageously generate a large amount of power.

Next, the description is directed to a thermoelectric generator 10 using the thus configured thermoelectric generating unit 1.

Figure 4A:
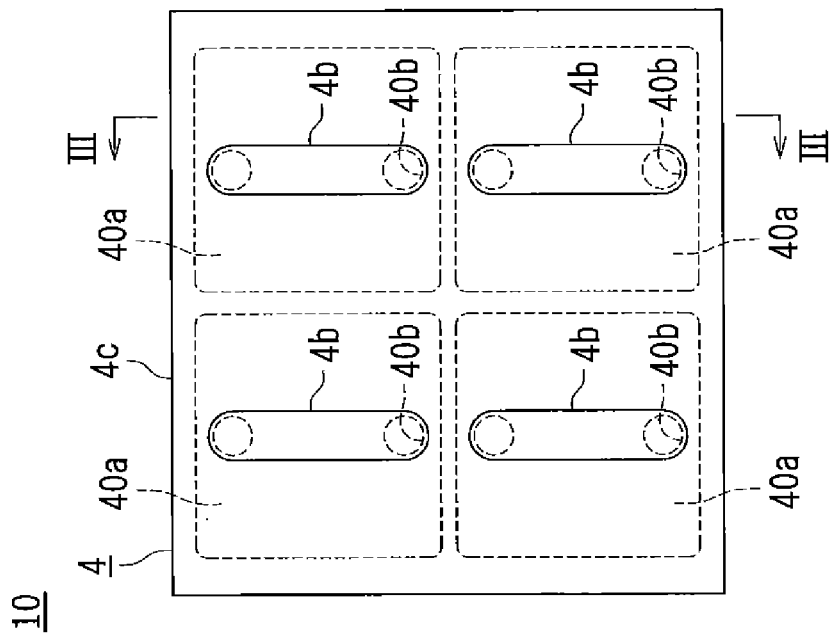

The thermoelectric generator 10 is composed of a plurality of thermoelectric generating units 1 aligned in a row direction and a column direction such that thermoelectric transducers 2 of the thermoelectric generating units 1 constitute a single plane. The thermoelectric transducers 2 are connected in series and/or in parallel, depending on the required electric power. The thermoelectric generating units 1 in the thermoelectric generator 10 may be independent of each other, with only the thermoelectric transducers 2 being electrically connected to each other. In this case, however, the thermoelectric generating units 1 tend to disintegrate when the thermoelectric generator 10 is installed, making the installation process troublesome. Therefore, as shown in FIG. 4, the thermoelectric generating units 1 may be integrated on a modular plate member 4c, with a plurality of plate-like cavities 40a being aligned in a row direction and a column direction. For convenience of description, the thermoelectric generating units 1 in FIG. 4 are arranged and connected two each in the row direction and the column direction. However, the number of thermoelectric generating units 1 is not particularly limited, and may be suitably selected as required or in consideration of the installation location.

The modular plate member 4c is composed of a main body 41c and a lid 42c which are integrally combined with each other. The main body 41c has four plate-like cavities 40a formed in a recessed manner, and the bottoms of the cavities 40a serve as heating surfaces 41. The lid 42c, when combined with the main body 41c, forms the connecting surface 42, with four tubular members 4b being connected at the positions opposed to the heating surfaces 41 of the main body 41c. The main body 41c and the lid 42c can be integrated by a process of; forming nickel-plated layers, one each on the joint surface of the main body 41c and that of the lid 42c in advance, or interposing a metal gasket of nickel metal in advance; then joining the main body 41c and the lid 42c and applying heat until the nickel metal melts; and finally cooling the main body 41c and the lid 42c. Similar to the plate-like hollow member 4a, if the thermoelectric transducers 2 have curved surfaces, the modular plate member 4c may be also formed in a plate-like shape having a curved surface.

The cooling part 3 may be provided individually for each of the thermoelectric transducers 2, or collectively for all of the four thermoelectric transducers 2, as shown in FIG. 4. In the latter case, the cooling water path 30 has a single plate-like path which makes contact with all of the four thermoelectric transducers 2 and which is arranged to distribute cooling water entirely. If the cooling water path 30 is arranged to distribute cooling water entirely, the configuration of the cooling water path 30 can be simplified without complications.

Figure 5B:
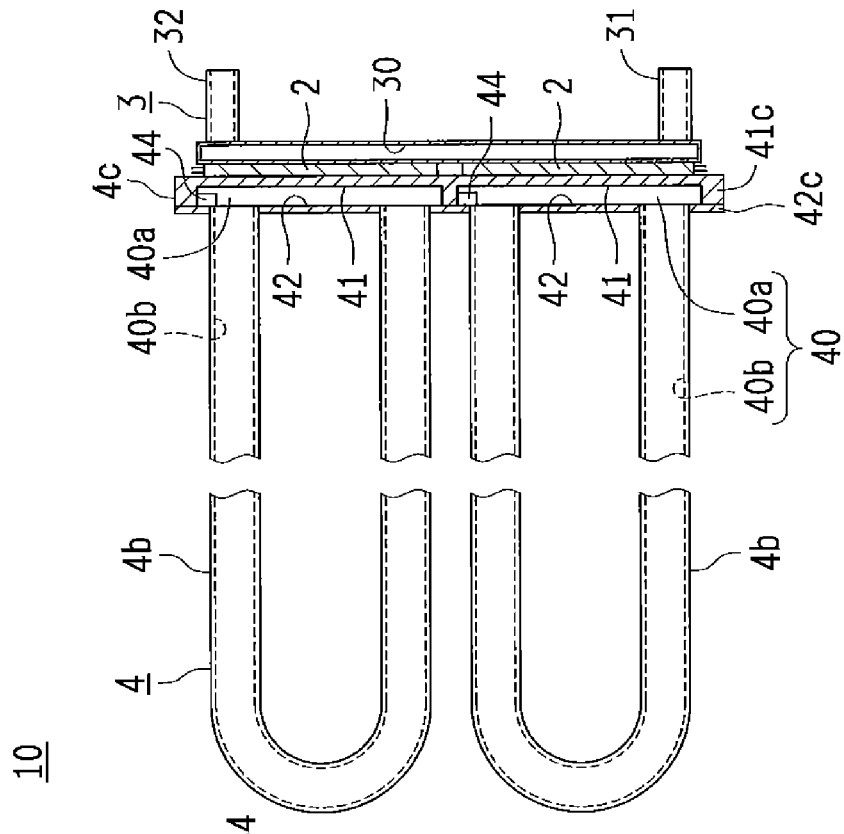
FIG. 5(*a*) is a front view showing another embodiment of the thermoelectric generator according to the present invention.
Figure 5A:
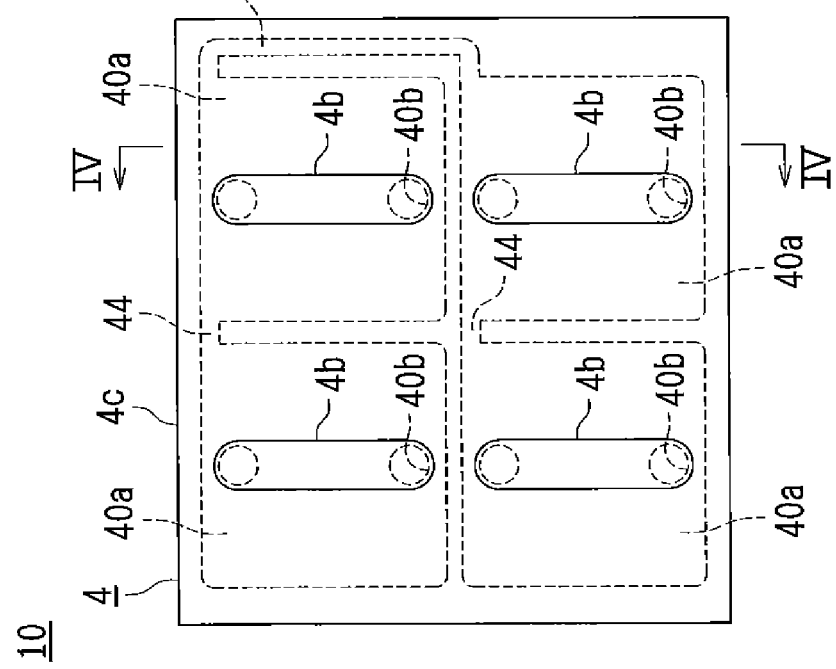
Figure 6A:
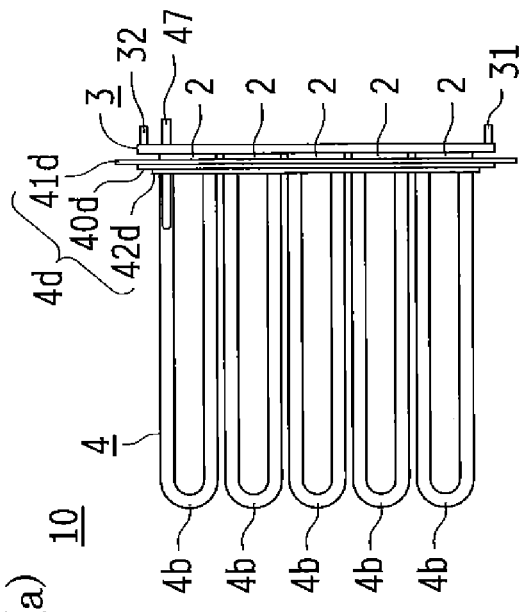
FIG. 6(*a*) is a side view showing yet another embodiment of the thermoelectric generator according to the present invention.
Figure 6B:
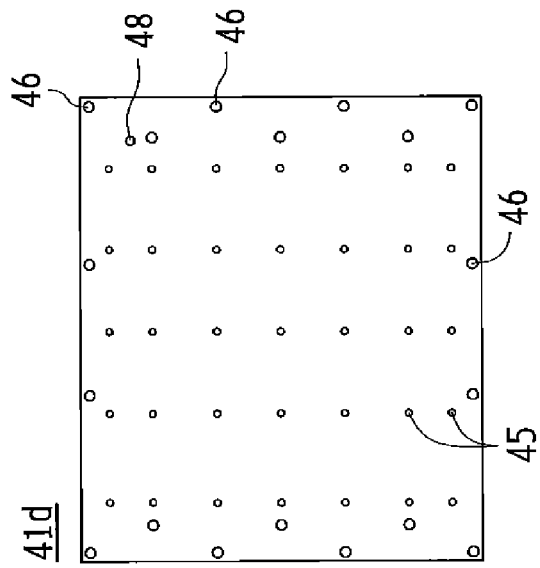
Figure 6C:
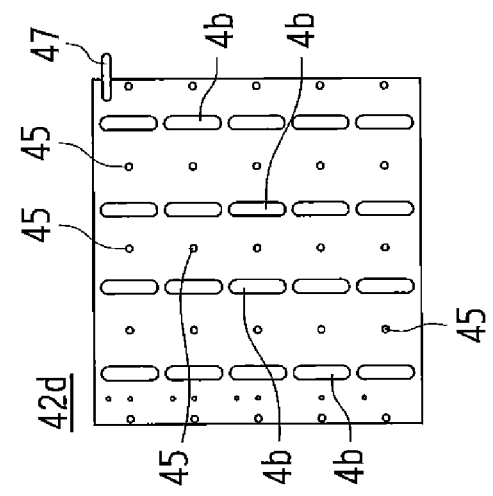
Figure 6D:
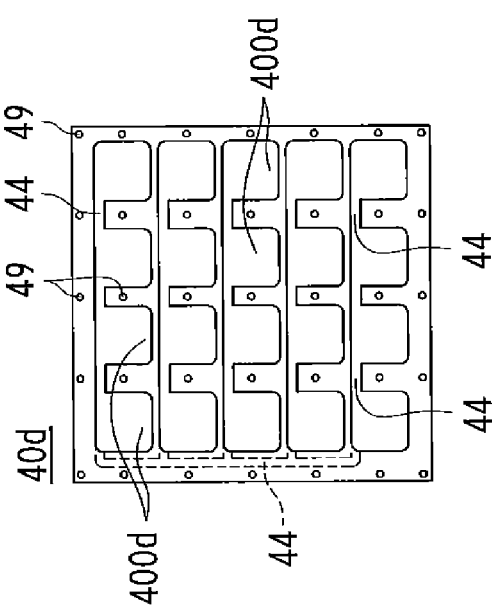

The thus configured thermoelectric generator 10 can be handled easily in the installation process. Even in this thermoelectric generator 10, however, the mutually independent arrangement of the plate-like cavities 40a may result in uneven heating of the thermoelectric transducers 2 in the thermoelectric generating unit 1, which may eventually deteriorate the power generation efficiency. To address this concern, a communication path 44 for mutually communicating the plate-like cavities 40a may be provided as shown in FIG. 5, in order to equalize steam pressures in the plate-like cavities 40a. In this case, the thermoelectric transducers 2 of the thermoelectric generating units 1 can be evenly heated by the steam generated in the plate-like cavities 40a. As a result, it is possible to prevent uneven heating of the thermoelectric transducers 2 and to equalize outputs from the thermoelectric transducers 2.

In an embodiment shown in FIG. 5, the four plate-like cavities 40a are provided for the four thermoelectric transducers 2 and communicated with each other by the communication path 44. Alternatively, one large plate-like cavity 40a may be provided for the four thermoelectric transducers 2. In this case, however, it is preferable to provide a plurality of bridges 43 in the single plate-like cavity 40a so as to avoid expansion of the plate-like cavity 40a.

FIG. 6 shows an embodiment of the thermoelectric generator 10, wherein twenty thermoelectric generating units 1 are integrally arranged in five rows and four columns.

In this thermoelectric generator 10, the portions corresponding to the plate-like hollow members 4a of the thermoelectric generating units 1 are replaced by a single modular plate member 4d in which the three components, i.e. a heating plate 41d, a connecting plate 42d, and a framing plate 40d, are joined integrally.

The heating plate 41d has a plate-like shape and is large enough to accommodate twenty heating surfaces 41 of the thermoelectric generating units 1 in five rows and four columns. The heating plate 41d is provided with positioning holes 45 in an area to be in contact with the framing plate 40d. The heating plate 41d is slightly larger than the connecting plate 42d and the framing plate 40d. The portion protruding from the connecting plate 42d and the framing plate 40d is provided with bolt holes 46 through which attachment bolts (not shown) are inserted to fix the thermoelectric generator 10. At a corner on the outer periphery of the heating plate 41d, a hole 48 which allows insertion of the charge pipe 47 for charging the heating medium into the plate-like cavity 40a is provided.

The connecting plate 42d has a plate-like shape and is large enough to accommodate twenty connecting surfaces 42 of the thermoelectric generating units 1 in five rows and four columns. Tubular members 4b are connected to the outer surfaces of the connecting surfaces 42. The connecting plate 42d is provided with positioning holes 45 in an area to be in contact with the framing plate 40d. The connecting surface 42 at one of the corners of the connecting plate 42d is connected not only with the tubular member 4b but also with the charge pipe 47 for charging the heating medium. The charge pipe 47 is formed in a U-shape, with one end being connected to the connecting plate 42d and the other end extending from the outer periphery of the connecting plate 42d in a direction opposite to an extension direction of the tubular member 4b.

The framing plate 40d is held between the heating plate 41d and the connecting plate 42d. In a state where the heating surfaces 41 of the heating plate 41d are opposed to the connecting surfaces 42 of the connecting plate 42d, the framing plate 40d creates a space and thereby provides compartments 400d such that twenty plate-like cavities 40a, in five rows and four columns, can be formed between the heating plate 41d and the connecting plate 42d. The compartments 400d are communicated with each other by the communication path 44. The framing plate 40d has projections 49 which fit in the holes 45 in the heating plate 41d and the holes 45 in the connecting plate 42d, so that the heating plate 41d, the connecting plate 42d, and the framing plate 40d can be combined without misalignment. The framing plate 40d is entirely plated with nickel.

To provide the modular plate member 4d, the heating plate 41d, the connecting plate 42d, and the framing plate 40d are combined and then heated entirely. The heating causes the nickel layer of the framing plate 40d to melt. Thereafter, the heating plate 41d, the connecting plate 42d, and the framing plate 40d are cooled and integrated by the molten nickel, and eventually form the modular plate member 4d.

The thus configured thermoelectric generator 10 can be provided efficiently in the case where many thermoelectric generating units 1 are arranged in column and row directions. Eventually, it is possible to cut the cost of the thermoelectric generator 10 as a whole.

Similar to the modular plate member 4d, the cooling part 3 may also be made of three integrated components. Alternatively, just like the modular plate member 4c as shown in FIGS. 4 and 5 and described above, the cooling part 3 may be made of two integrated components.

Figure 7A:
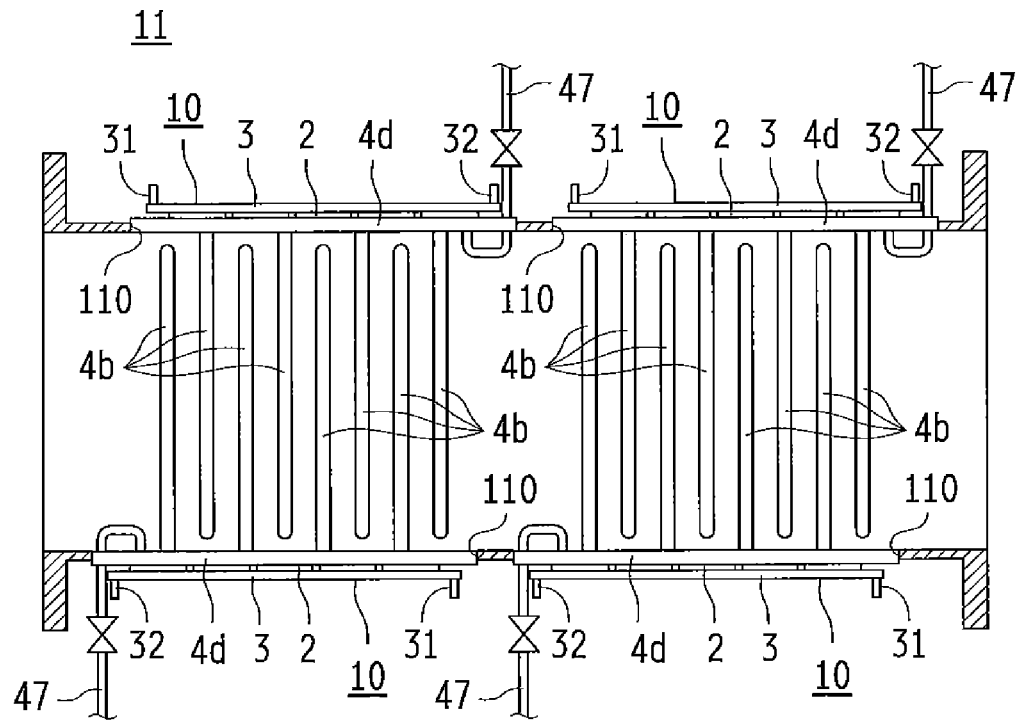
FIG. 7(*a*) is a partial horizontal sectional view showing an exhaust duct equipped with the thermoelectric generators according to the present invention.
Figure 7B:
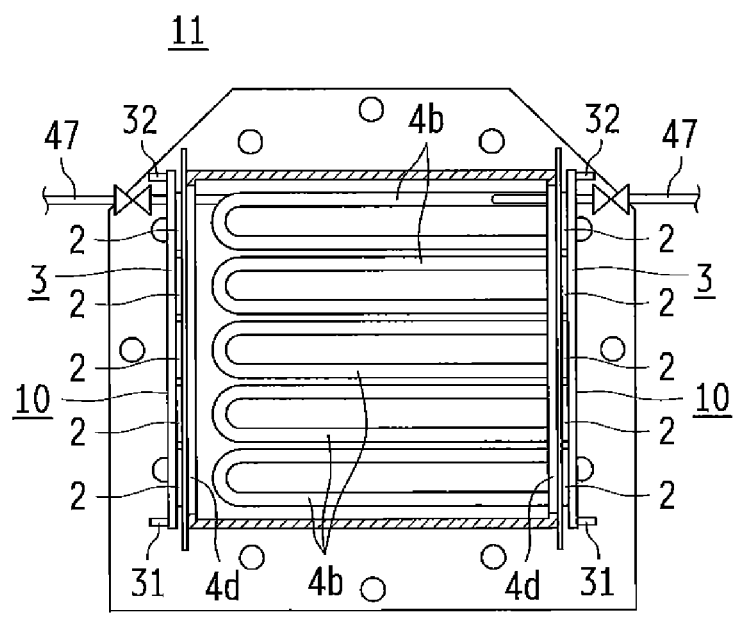

FIG. 7 represents an exhaust duct 11 using the thermoelectric generator 10 shown in FIG. 6.

The exhaust duct 11 has openings 110 which are arranged horizontally to the exhaust duct 11 in an opposed manner. The size of each opening 110 is such that the connecting plate 42d and the framing plate 40d of the thermoelectric generator 10 can be inserted and that the outer periphery of the heating plate 41d abuts on the edge of the opening 110. The opposed openings 110 are offset from each other in an exhaust gas flow direction, by a distance as half as the gap between the adjacent tubular members 4b. The tubular members 4b of the thermoelectric generators 10 are inserted in the opposed openings 110, and fixed in an overlapped state without interfering with each other. In this manner, the exhaust duct 11 is equipped with two sets of thermoelectric generators 10 (i.e. four thermoelectric generators 10 in total) in the exhaust gas flow direction. The number of sets is not particularly limited, and may be only one set of (i.e. a pair of) thermoelectric generators 10, or three sets or more. The number of sets can be suitably decided in consideration of the amount and temperature of exhaust gas passing in the exhaust duct 11.

In the exhaust duct 11 equipped with the thermoelectric generators 10 in the above-mentioned mounting structure, exhaust gas passes the tubular members 4b of the opposed thermoelectric generators 10 alternately. Thus, the exhaust duct 11 can avoid uneven heat supply on either one of the opposed thermoelectric generators 10, and can equalize power generation capability of both of the opposed thermoelectric generators 10. Besides, the opposed thermoelectric generators 10 are offset alternately such that the opposed tubular members 4b overlap without interference. Owing to this structure, the thermoelectric generators 10 do not excessively protrude from the original size of the exhaust duct 11, and can be mounted compactly. Therefore, it is possible to minimize the installation space for the exhaust duct 11 equipped with the thermoelectric generators 10.

In each of the thermoelectric generators 10 mounted in the exhaust duct 11, not only the tubular members 4b but also the portion corresponding to the connecting surface 42 of the plate-like hollow member 4a faces the inside of the exhaust duct 11. Hence, when steam is transferred from the tubular cavities 40b of the tubular members 4b to the plate-like cavities 40a of the plate-like hollow member 4a, the steam can be transferred with excellent thermal efficiency without heat loss, so that the thermoelectric transducers 2 can be heated efficiently.

The exhaust duct 11 is mounted in replacement of a part of an existing exhaust duct. Alternatively, the openings 110 may be directly formed in an existing exhaust duct, and the thermoelectric generators 10 may be mounted therein.

Figure 8A:
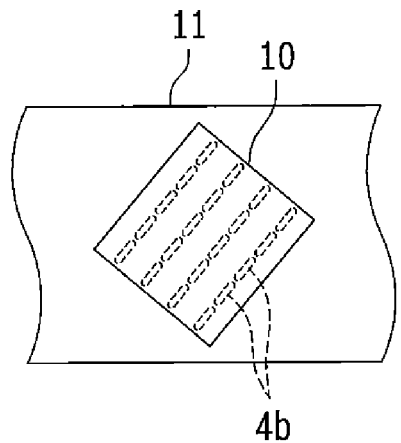
FIGS. 8(*a*)-8(*d*) are schematic views showing other embodiments of the exhaust duct according to the present invention.
Figure 8B:
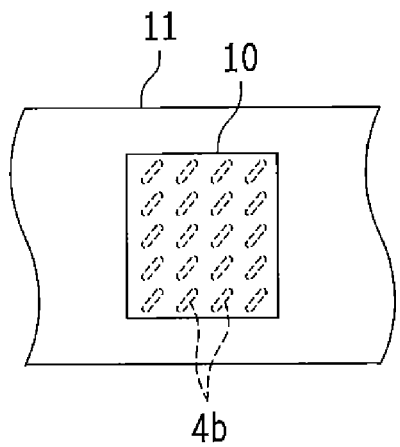
Figure 8C:
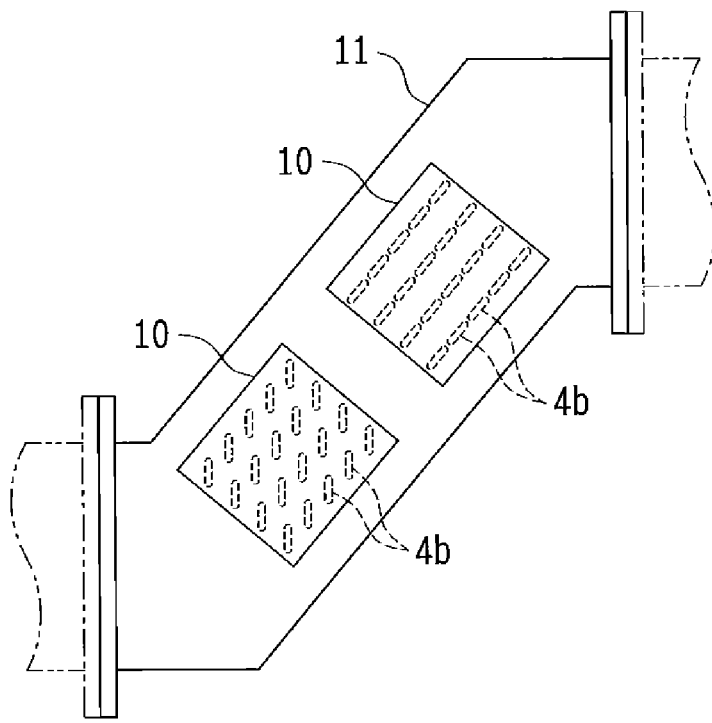
Figure 8D:
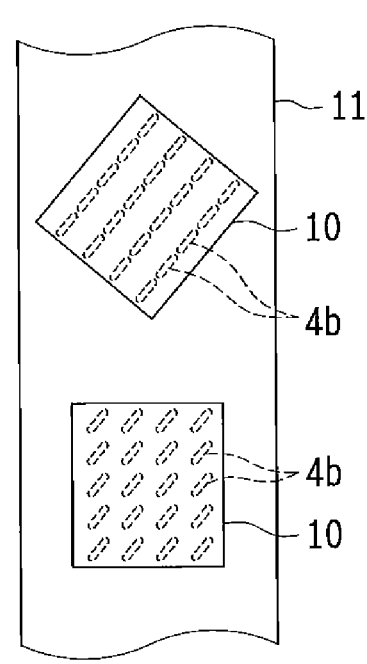
Figure 9A:
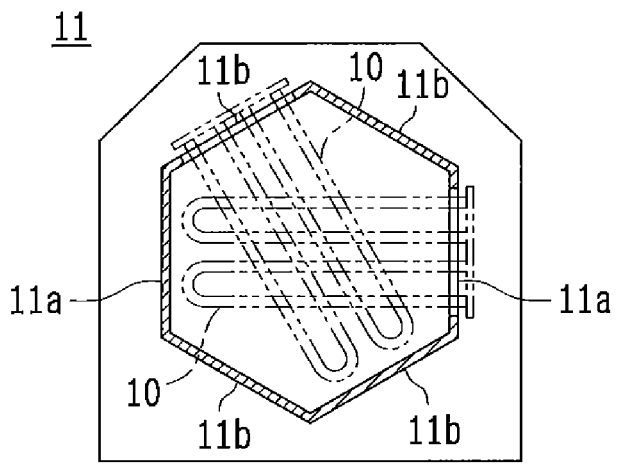
FIGS. 9(a)-9(c) are schematic views showing how the thermoelectric generators are mounted in the exhaust ducts according to the present invention having different cross sections.
Figure 9B:
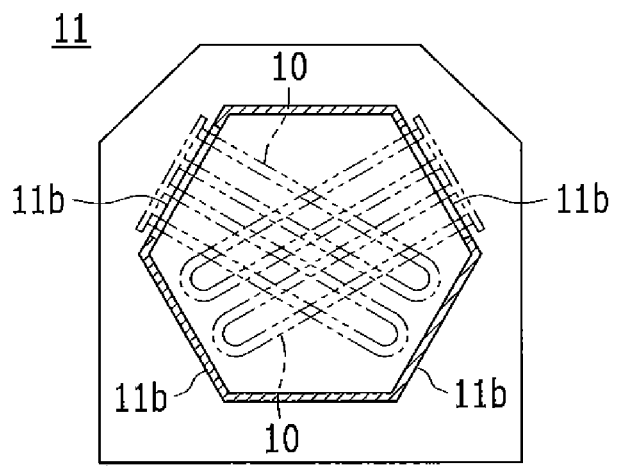
Figure 9C:
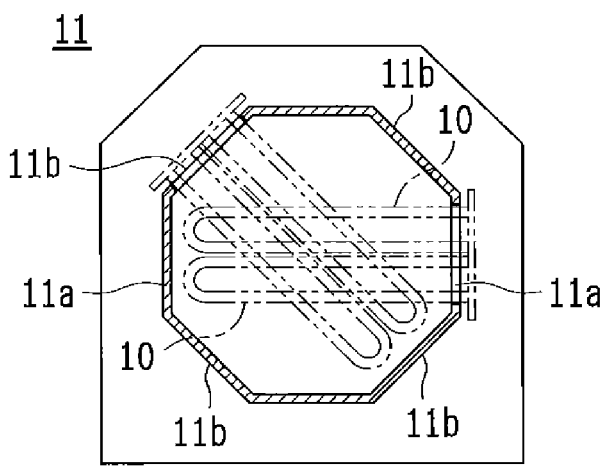

In the above embodiment, the thermoelectric generators 10 are arranged horizontally to the exhaust duct 11 in an opposed manner. As far as the two open ends of each tubular member 4b can be located at different heights in the direction of gravitational force, the thermoelectric generators 10 may not necessarily be mounted horizontally, as exemplified below. As shown in FIG. 8(a), the thermoelectric generators 10 can be mounted obliquely to the exhaust duct 11 without problem. As shown in FIG. 8(b), the thermoelectric generators 10 may be mounted horizontally to the exhaust duct 11 in an opposed manner just as described above, but the tubular members 4b may be oblique to a center line which connects center lines of two opposed sides of the connecting surface 42. In the case where the exhaust duct 11 itself is arranged obliquely as shown in FIG. 8(c) or vertically as shown in FIG. 8(d), the mounting structure of the thermoelectric generators 10 is not particularly limited as far as the two open ends of each tubular member 4b, after mounted, can be located at different heights in the direction of gravitational force. Further referring to FIG. 9, the thermoelectric generators 10 may be mounted at one or more positions on side surfaces 11a or inclined surfaces 11b of the exhaust duct 11 having, for example, a hexagonal cross-section (see FIGS. 9(a) and 9(b)) or an octagonal cross-section (see FIG. 9(c)).

Additionally, an engine (not shown) may be equipped in advance with an exhaust duct using the above-described thermoelectric generators 10, so that the engine can recover electric power from exhaust gas.

The amount of heating medium to be charged in the circulation path 40 depends on the size of the thermoelectric generator 10, and the flow rate and temperature of exhaust gas at the installation location. Hence, the charge amount of heating medium is controlled by means of the charge pipe 47 so as to maximize the output. The heating medium is not particularly limited, but water is preferable in terms of cost.

The above-described thermoelectric generator 10 can serve effectively not only in the exhaust duct 11 of the engine as described above, but also in a region where a relatively low temperature (about 200° C.-300° C.) hot fluid flows, such as on the downstream side of an exhaust duct in a combustion path.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

REFERENCE SIGNS LIST 1 thermoelectric generating unit
10 thermoelectric generator
11 exhaust duct
110 opening
2 thermoelectric transducer
3 cooling part
4 heating part
4a plate-like hollow member
4b tubular member
4c modular plate member
4d modular plate member
40 circulation path
40a plate-like cavity
40b tubular cavity
41 heating surface
42 connecting surface
43 reinforcement bridge
44 communication path
41d heating plate
42d connecting plate
40d framing plate

The invention claimed is:

1. A thermoelectric generator comprising:
one or more thermoelectric generating units, each thermoelectric generating unit of the one or more thermoelectric generating units comprising:
a thermoelectric transducer that comprises:
a cooling part on a cold side of the thermoelectric transducer; and
a heating part on a hot side of the thermoelectric transducer for supplying steam of a heating medium, and which is configured to generate electric power by a temperature difference between the cold side and the hot side,
wherein the heating part comprises:
a plate-like hollow member provided along a hot-side surface of the thermoelectric transducer, the plate-like hollow member forming a plate-like cavity inside; and
a tubular member having two open ends being positioned distantly from each other and connected to the plate-like hollow member, the tubular member forming a tubular cavity communicating the plate-like cavity with the two open ends, the tubular member heated from outside by a hot fluid, and
wherein the plate-like cavity and the tubular cavity form a circulation path in which a heating medium charged in the cavities circulates.

2. The thermoelectric generator according to claim 1, wherein:
the two open ends of the tubular member are connected to a same connecting surface of the plate-like hollow member, and
the connecting surface is opposed to a heating surface of the plate-like hollow member which makes contact with the thermoelectric transducer.

3. The thermoelectric generator according to claim 1, wherein a reinforcement bridge which connects a connecting surface and a heating surface is provided in the plate-like cavity of the plate-like hollow member, at a position that keeps communication between the plate-like hollow member and the two open ends of the tubular member and that does not completely block the plate-like cavity.

4. The thermoelectric generator according to claim 1 wherein the one or more comprise a plurality of thermoelectric generating units, each of the plurality of thermoelectric generating units:
arranged in a row direction and a column direction, and connected to each other in a planar pattern.

5. The thermoelectric generator according to claim 4, wherein a heating surface of each of the plate-like hollow members are partially or entirely integrated in a modular plate-like form.

6. The thermoelectric generator according to claim 4, wherein the plate-like cavities of adjacent ones of the thermoelectric generating units are communicated by a path.

7. The thermoelectric generator according to claim 5, further comprising:
a heating plate which constitutes the heating surface;
a connecting plate which constitutes a connecting surface to which the tubular members are connected; and
a framing plate which creates a space between the heating surface and the connecting surface and thereby provides at least one plate-like cavity,
wherein the heating plate, the connecting plate, and the framing plate are joined together in a modular plate-like form in which the plate-like hollow members are integrated.

8. The thermoelectric generator according to claim 4, further comprising:
a mounting structure that comprises a duct that has an opening; and wherein:
a cooling surface of each of the cooling parts is at least partially integrated in a modular plate-like form;
the thermoelectric generators are mounted in such a manner as to close the opening; and
a connecting surface for the tubular members and the plate-like hollow members is exposed in the duct.

9. The thermoelectric generator according to claim 4, further comprising
a mounting structure comprising a duct has a plurality of openings, and
wherein:
the thermoelectric generators are mounted in such a manner as to close the openings, and
the tubular members exposed in the duct are arranged in an overlapped manner in a gas flow direction in the duct.

* * * * *